United States Patent
Yen et al.

(10) Patent No.: US 7,948,286 B2
(45) Date of Patent: May 24, 2011

(54) BANDWIDTH CONTROL APPARATUS FOR PHASE LOCK LOOP AND METHOD THEREOF

(75) Inventors: Shih-Chieh Yen, Hsinchu Hsien (TW); Yao-Chi Wang, Hsinchu Hsien (TW); Ming-Yu Hsieh, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 12/862,346

(22) Filed: Aug. 24, 2010

(65) Prior Publication Data

US 2011/0080199 A1  Apr. 7, 2011

(30) Foreign Application Priority Data

Oct. 1, 2009 (TW) ................... 98133340 A

(51) Int. Cl.
*H03L 7/06* (2006.01)
(52) U.S. Cl. .................. 327/157; 327/148
(58) Field of Classification Search ............ 327/148, 327/157
See application file for complete search history.

(56) References Cited

U.S. PATENT DOCUMENTS

| | | | | |
|---|---|---|---|---|
| 5,610,954 A * | 3/1997 | Miyashita et al. | ............ | 375/375 |
| 5,821,789 A * | 10/1998 | Lee | ................. | 327/156 |
| 6,320,435 B1 * | 11/2001 | Tanimoto | ...................... | 327/156 |
| 6,894,546 B2 * | 5/2005 | Mika et al. | ...................... | 327/157 |
| 6,941,116 B2 * | 9/2005 | Jensen et al. | ..................... | 455/76 |
| 7,917,088 * | 3/2011 | Hyde et al. | .................... | 455/41.2 |
| 2010/0264964 A1 * | 10/2010 | Furuta | ........................... | 327/157 |
| 2011/0006820 A1 * | 1/2011 | Liu et al. | ........................ | 327/157 |

* cited by examiner

*Primary Examiner* — Lincoln Donovan
*Assistant Examiner* — Adam D Houston
(74) *Attorney, Agent, or Firm* — Andy M. Han

(57) ABSTRACT

A loop bandwidth control apparatus applied to a phase locked loop (PLL) includes a first loop filter module, a second loop filter module, a control module, a first switching module, and a second switching module. The first filter module and the second loop filter module output a first voltage and a second voltage, respectively. The second loop filter module has a bandwidth different from that of the first loop filter module. According to one of the first voltage and the second voltage, the control module generates a bandwidth control signal. According to the bandwidth control signal, the first switching module forms a path between a charge pump and one of the first loop filter module and the second loop filter module, and the second switching module forms a path between a voltage-controlled oscillator (VCO) and one of the first loop filter module and the second loop filter module.

20 Claims, 7 Drawing Sheets

BANDWIDTH CONTROL APPARATUS FOR PHASE LOCK LOOP AND METHOD THEREOF

CROSS REFERENCE TO RELATED PATENT APPLICATIONS

This patent application claims priority from Taiwan Patent Application No. 098133340, filed in the Taiwan Patent Office on Oct. 1, 2009, entitled "Bandwidth Control Apparatus for Phase Lock Loop and Method Thereof", and incorporates the Taiwan patent application in its entirety by reference.

TECHNICAL FIELD

The present disclosure relates to a phase locked loop (PLL), and more particularly, to a loop bandwidth control apparatus applied to a PLL and a method thereof.

BACKGROUND OF THE PRESENT DISCLOSURE

A PLL can be regarded as a feedback circuit system that compares to an inputted phase with a feedback phase to adjust a outputted phase, i.e., the PLL used in a transmitter is inputted with a low-frequency (LF) periodic signal to output a high-frequency (HF) periodic signal, with a certain constant phase relationship between the inputted signal and the outputted signal. The PLL mainly comprises a phase frequency detector (PFD), a charge pump, a loop filter and a voltage controlled oscillator (VCO). In practice, the PLL is widely applied to electronic and communication products, e.g., memories, microprocessors, hard disk driving apparatuses, radio frequency (RF) transceivers, and fiber optic transceivers.

FIG. 1 shows a block diagram of a conventional PLL. A PLL 1 comprises a phase frequency detector (PFD) 10, a charge pump 12, a loop filter 14, a voltage controlled oscillator (VCO) 16 and a frequency divider 18. The charge pump 12 is coupled between the PFD 10 and the loop filter 14, the loop filter 14 is coupled to the VCO 16, and the frequency divider 18 is coupled between the PFD 10 and the VCO 16.

Upon receiving a reference clock CKR and a feedback clock CKV, the PFD 10 compares the reference clock CKR with the feedback clock CKV to generate a phase difference $\Delta\Phi$ that is transmitted to the charge pump 12. The feedback clock CKV is generated by the frequency divider 18 from frequency dividing an output frequency $f_{out}$ of the VCO 16 with a predetermined divisor. According to the phase difference $\Delta\Phi$, the charge pump 12 generates a corresponding charge pump current I that is outputted to the loop filter 14. Upon receiving the charge pump current I, the loop filter 14 converts the charge pump current I into a control voltage V via its impedance, and outputs the control voltage V to the VCO 16. After that, the VCO 16 generates a corresponding output frequency $f_{out}$ according to the control voltage V.

The loop filter 14 is one of most critical components of the PLL 1. Considering cost and efficiency, the PLL 1 is commonly realized by a second-order low-pass filter composed of resistors and capacitors. Generally speaking, the PLL 14 has several important parameters, e.g., phase margin, loop bandwidth, and loop filter topology, and the loop bandwidth needed for eliminating noises and determining a locking time is the most critical parameter.

When the loop frequency of the loop filter 14 is small, although the loop filter 14 can effectively eliminate noises created by inputting the reference frequency and switching the charge pump 12 as well as reducing undesirable effects caused by jitter, a disadvantage that the loop filter 14 requires a long locking time is incurred since the locking time is directly proportional to the loop bandwidth. On the contrary, when the loop bandwidth of the loop filter 14 is enlarged, the locking time is reduced; nevertheless, the PLL 14 can not restrain the foregoing noises.

Therefore, one object of the present disclosure is to provide a loop bandwidth control apparatus applied to a PLL and a method thereof to solve the foregoing problem.

SUMMARY OF THE PRESENT DISCLOSURE

According to an embodiment of the present disclosure, a loop bandwidth control apparatus is applied to a phase locked loop (PLL) that comprises a phase frequency detector (PFD), a charge pump, and a voltage controlled oscillator (VCO). The loop bandwidth control apparatus comprises a first loop filter module, a second loop filter module, a control module, a first switching module, and a second switching module. The first loop filter module and the second loop filter module respectively output a first voltage and a second voltage, and a bandwidth of the second loop filter module is different from that of the first loop filter module. The control module generates a bandwidth control signal according to the first voltage or the second voltage. According to the bandwidth control signal, the first switching module forms a path between the charge pump and one of the first loop filter module and the second loop filter module, and the second switching module forms a path between the VCO and one of the first loop filter module and the second loop filter module.

According to another embodiment of the present disclosure, a loop bandwidth control method is applied to a PLL that comprises a loop bandwidth control apparatus, a phase frequency detector (PFD), a charge pump and a voltage controlled oscillator (VCO). The loop bandwidth control apparatus comprises a first loop filter module and a second loop filter module, and a bandwidth of the second loop filter module is different from that of the first loop filter module. The loop bandwidth control method comprises generating a bandwidth control signal according to a first voltage outputted by the first loop filter module or a second voltage outputted by the second loop filter module; and forming a path between the charge pump and a VCO via the first loop filter module or the second loop filter according to the bandwidth control signal.

According to yet another embodiment of the present disclosure, a phase locked loop (PLL) comprises a phase frequency detector (PFD), a charge pump, a voltage controlled oscillator (VCO), a frequency divider, and a loop bandwidth control apparatus. The loop bandwidth control apparatus comprises a first loop filter module, a second loop filter module, a control module, a first switching module, and a second switching module. The PFD generates a phase difference according to a reference clock and a feedback clock. The charge pump generates an output current according to the phase difference. The VCO generates an output frequency according to a control voltage. The frequency divider generates the feedback clock according to the output frequency. The first loop filter module and the second loop filter module respectively generate a first voltage and a second voltage according to the output current. A bandwidth of the second loop filter module is larger than that of the first loop filter module. The control module monitors the first voltage and the second voltage to generate a bandwidth control signal according to the first voltage and the second voltage. According to the bandwidth control signal, the first switching module forms a path between the charge pump and the first loop filter module or the second loop filter module, and the second switching module forms a path between the VCO and the first loop filter module or the second loop filter module.

In conclusion, according to a loop bandwidth control apparatus and a method thereof provided by the present disclosure, by switching between loop filter modules of different bandwidths, a PLL under a VCO calibration mode is given a large loop bandwidth, such that a time for calibrating a control voltage of the VCO is significantly reduced to solve the foregoing problem. In addition, when the PLL operates under a normal operation mode, the loop bandwidth of the PLL recovers to normal instead of being too large, so that noise eliminating capabilities of the PLL are preserved.

The advantages and spirit related to the present disclosure can be further understood via the following detailed description and drawings.

DETAILED DESCRIPTION OF THE PREFERRED EMBODIMENT

Figure 1:
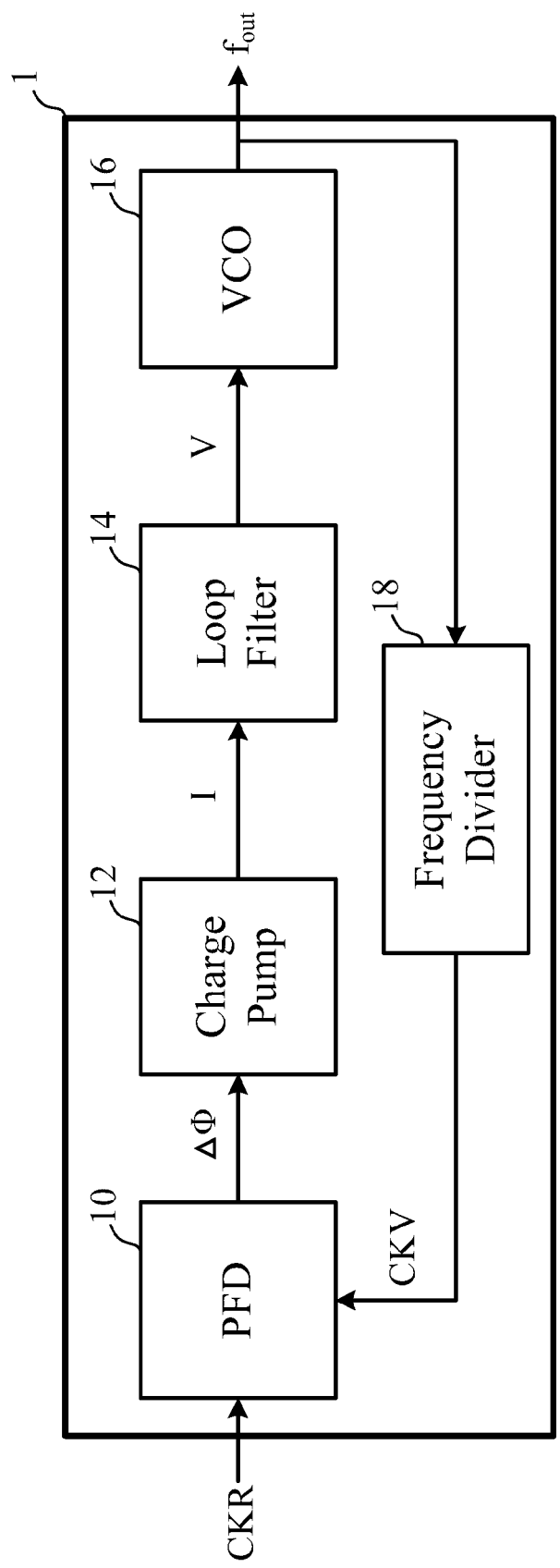
FIG. 1 is a block diagram of a conventional PLL.
Figure 2:
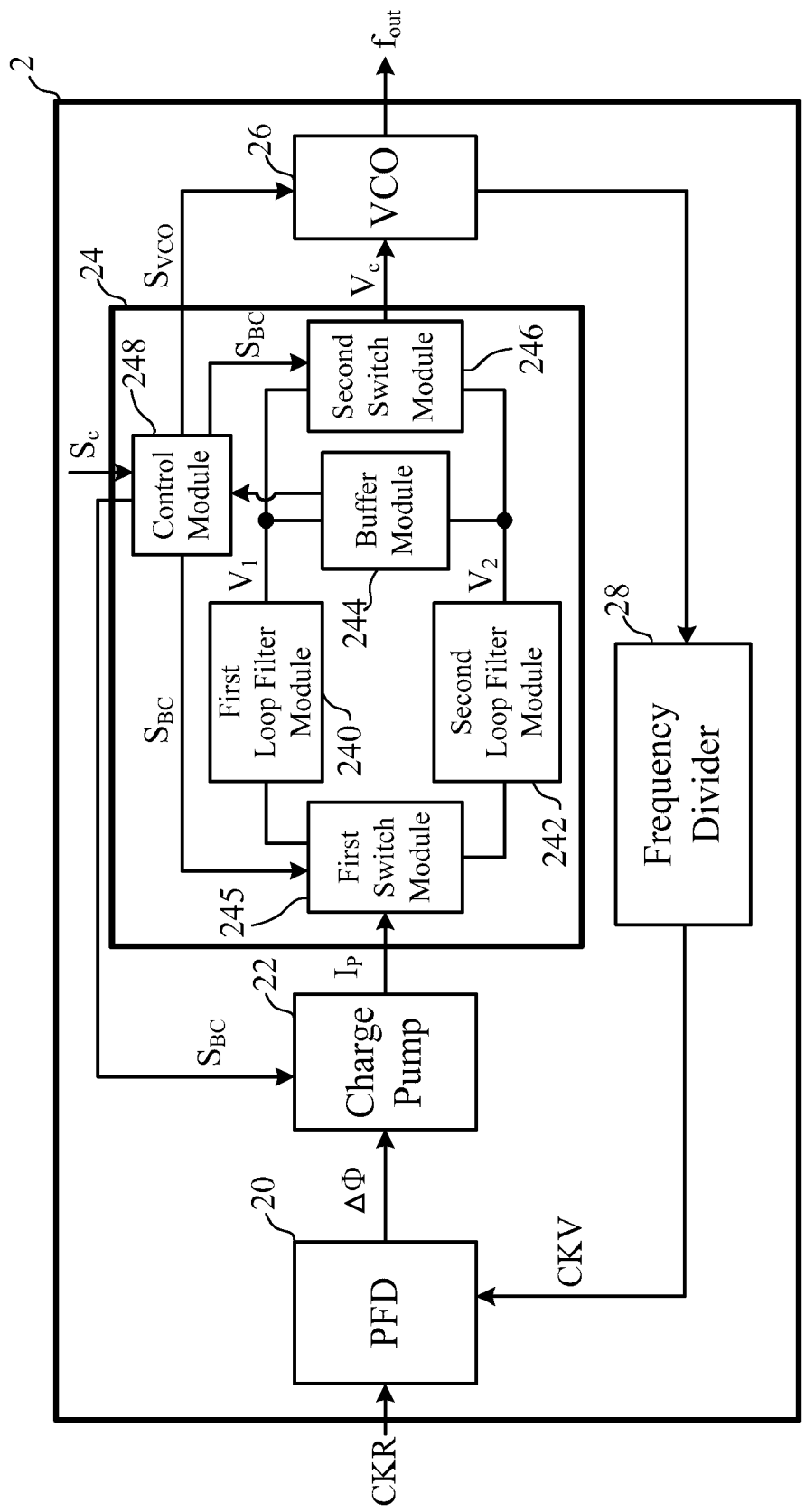
FIG. 2 is a block diagram of a PLL in accordance with a first embodiment of the present disclosure.

According to an embodiment of the present disclosure, a PLL is provided. FIG. 2 shows a block diagram of a PLL 2. The PLL 2 mainly comprises a PFD 20, a charge pump 22, a loop bandwidth control apparatus 24, a VCO 26, and a frequency divider 28. The loop bandwidth control apparatus 24 comprises a first loop filter module 240, a second loop filter module 242, a buffer module 244, a first switching module 245, a second switching module 246, and a control module 248.

The PFD 20 is coupled to the charge pump 22. The first switching module 245 is coupled to input ends of the first loop filter module 240 and the second loop filter module 242, and the charge pump 22. The buffer module 244 is coupled to output ends of the first loop filter module 240 and the second loop filter module 242. The control module 248 is coupled to the charge pump 22, the first switching module 245, the second switching module 246, the buffer module 244 and the VCO 26. The second switching module 246 is coupled to the output ends of the first loop filter module 240 and the second loop filter module 242, and the VCO 26. The frequency divider 28 is coupled to the PFD 20 and the VCO 26.

In this embodiment, upon receiving a reference clock CKR and a feedback clock CKV, the phase bandwidth detector 20 compares the reference clock CKR with the feedback CKV to generate a phase difference $\Phi$ that is transmitted to the charge pump 22. The feedback clock CKV is obtained by the frequency divider 28 from dividing an output frequency $f_{out}$ outputted by the VCO 26 with a predetermined divisor. After that, the charge pump 12 generates a corresponding charge pump current $I_p$ according to the received phase difference $\Phi$, and outputs the charge pump current $I_p$ to the first loop filter module 240 or the second loop filter module 242 via the first switching module 245. The first loop filter module 240 or the second loop filter module 242 generates a first voltage $V_1$ or a second voltage $V_2$ according to the charge pump current $I_p$. The control module 248 monitors the first voltage $V_1$ or the second voltage $V_2$, and generates a bandwidth control signal according to either the first voltage $V_1$ or the second voltage $V_2$. More specifically, the control module 248 compares a reference voltage with the first voltage $V_1$ or the second voltage $V_2$, and determines whether an absolute value of a difference between the reference voltage and the first voltage $V_1$ or the second voltage $V_2$ is smaller than a predetermined value. When a determination result of the control module 248 is negative, it means that calibration of the output frequency $f_{out}$ of the VCO 26 is not yet completed, such that the control module generates a VCO control signal $S_{VCO}$ for adjusting a VCO curve of the VCO 26. When the determination result of the control module 248 is positive, it means that calibration of the output frequency $f_{out}$ is completed, such that the control module 248 generates a bandwidth control signal $S_{BC}$ for switching loop modules and adjusting the charge pump current $I_p$. In practice, the reference voltage is related to the VCO curve of the VCO 26. For example, the reference voltage is, but not limited to, a $V_{c1}$ between $V_{c1}(max)$ and $V_{c1}(min)$ in FIG. 6.

It is to be noted that, in the loop bandwidth control apparatus 24, a bandwidth of the second loop filter module 242 is larger than that of the first loop filter module 240. In order to eliminating a charge sharing effect between the first loop filter module 240 and the second loop filter module 242, the buffer module 244 drives the first loop filter module 240 having the smaller bandwidth, so that the first voltage $V_1$ outputted by the first loop filter module 240 approximately equalizes the second voltage $V_2$ outputted by the second loop filter module 242 having the larger bandwidth.

In practical applications, the control module 248 is not limited to simultaneously switching the first switching module 245 and the second switching module 246 to the first loop filter module 240 or the second loop filter module 242 from monitoring the first voltage $V_1$ or the second voltage $V_2$. The control module 248 also could receive a setting signal $S_c$ to simultaneously switch the first switching module 245 and the second switching module 246 to the first loop filter module 240 or the second loop filter module 242, so as to correspond to different applications of the PLL 2.

For example, when the PLL 2 is applied to a transmitting end Tx, the control module 248 simultaneously switches the first switching module 245 and the second switching module 246 to the first loop filter module 240; when the PLL 2 is applied to a receiving end Rx, the control module 248 simultaneously switches the first switching module 245 and the second switching module 246 to the first loop filter module 242. In another embodiment, when the PLL 2 is applied to a Bluetooth wireless transmission apparatus, the control module 248 simultaneously switches the first switching module 245 and the second switching module 246 to the first loop filter module 240; when the PLL 2 is applied to a WiFi wireless transmission apparatus, the control module 248 simultaneously switches the first switching module 245 and the second switching module 246 to the first loop filter module 242. However, the present disclosure is not limited to the foregoing embodiments.

Figure 3:
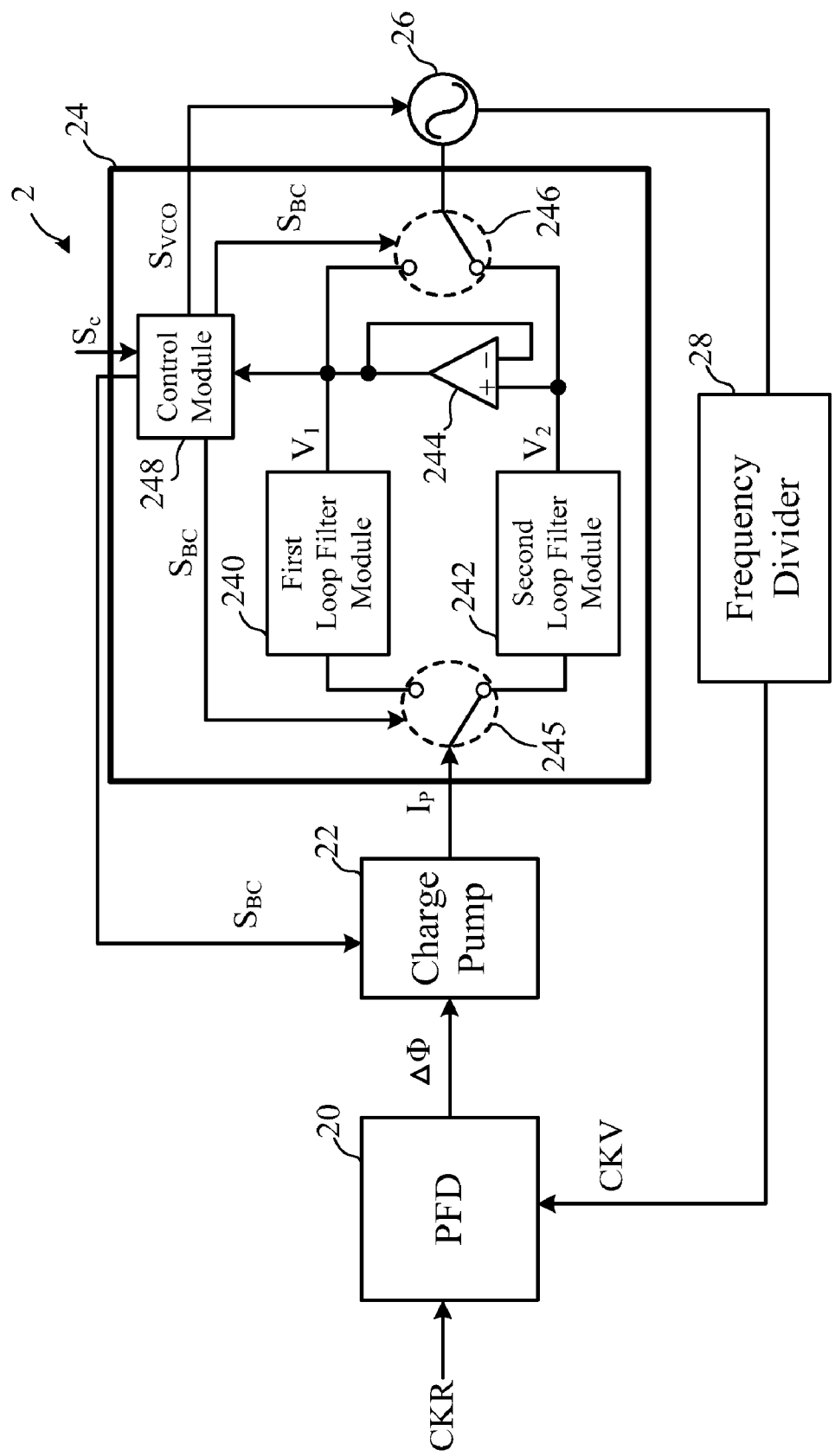
FIG. 3 is a schematic diagram of the PLL in FIG. 2 in accordance with an embodiment of the present disclosure.

FIG. 3 shows a schematic diagram of the PLL 2 in FIG. 2 in accordance with an embodiment of the present disclosure.

In this embodiment, the buffer module 244 applies a negative feedback operational amplifier (OA) circuit, which has an output end connected to its negative input end. A first voltage $V_1$ outputted by the first loop filter module 240 is coupled to the output end of the OA, and a second voltage $V_2$ outputted by the second loop filter module 242 is coupled to a positive end of the OA, so as to maintain the first voltage $V_1$ to be equal to the second voltage $V_2$. The control module 248 determines whether an absolute value of a difference between the reference voltage and the first voltage $V_1$ or the second voltage $V_2$ is smaller than a predetermined value to generate a determination result, and generates a bandwidth control signal $S_{BC}$ and a VCO control signal $S_{VCO}$ according to the determination result.

The control module 248 controls the charge pump 22 to adjust an output current according to the bandwidth control signal $S_{BC}$, and simultaneously switches the first switching module 245 and the second switching module 246 to the first loop filter module 240 or the second loop filter module 242 according to the bandwidth control signal $S_{BC}$, such that a path between the charge pump 22 and the VCO 26 is formed via the first loop filter module 240 or the second loop filter module 242. In addition, the control module 248 adjusts a VCO curve of the VCO 26 according to the VCO control signal $S_{VCO}$.

When the path between the charge pump 22 and the VCO 26 is formed via the first loop filter module 240, a control voltage $V_c$ received by the VCO 26 is the first voltage $V_1$ outputted by the first loop filter module 240. When the path between the charge pump 22 and the VCO 26 is formed via the second loop filter module 242, the control voltage $V_c$ received by the VCO 26 is the second voltage $V_2$ outputted by the second loop filter module 242.

Through the foregoing switching approach, when the PLL 2 operates under a VCO calibration mode, the path between the charge pump 22 and the VCO 26 is formed via the second loop filter module 242 having the larger bandwidth to enlarge the loop bandwidth of the PLL 2, so as to reduce a locking time needed by the PLL 2 for calibrating the VCO curve of the VCO 26. Since the control voltage $V_c$ approximates the reference voltage when calibration of the VCO curve of the VCO 26 is completed, it is determined whether the VCO completes the calibration according to the control voltage $V_c$. In practice, the reference voltage is a predetermined value or is user-defined according to actual requirements.

At this point, since the second loop filter module 242 with the larger bandwidth may decrease its noise eliminating capabilities, i.e., the PLL 2 operated under the normal operation mode only needs a normal loop bandwidth. Accordingly, the first switching module 245 and the second switching module 246 simultaneously switch to the first loop filter module 240 having the smaller bandwidth so as to form the path between the charge pump 22 and the VCO 26 via the first loop filter module 240, such that the PLL is given higher noise eliminating capabilities under the normal operation mode.

In addition, referring to FIG. 3, the charge pump 22 is also coupled to the control module 248, and adjusts an output charge pump current $I_p$ according to the bandwidth control signal $S_{BC}$ outputted by the control module 248.

Figure 4:
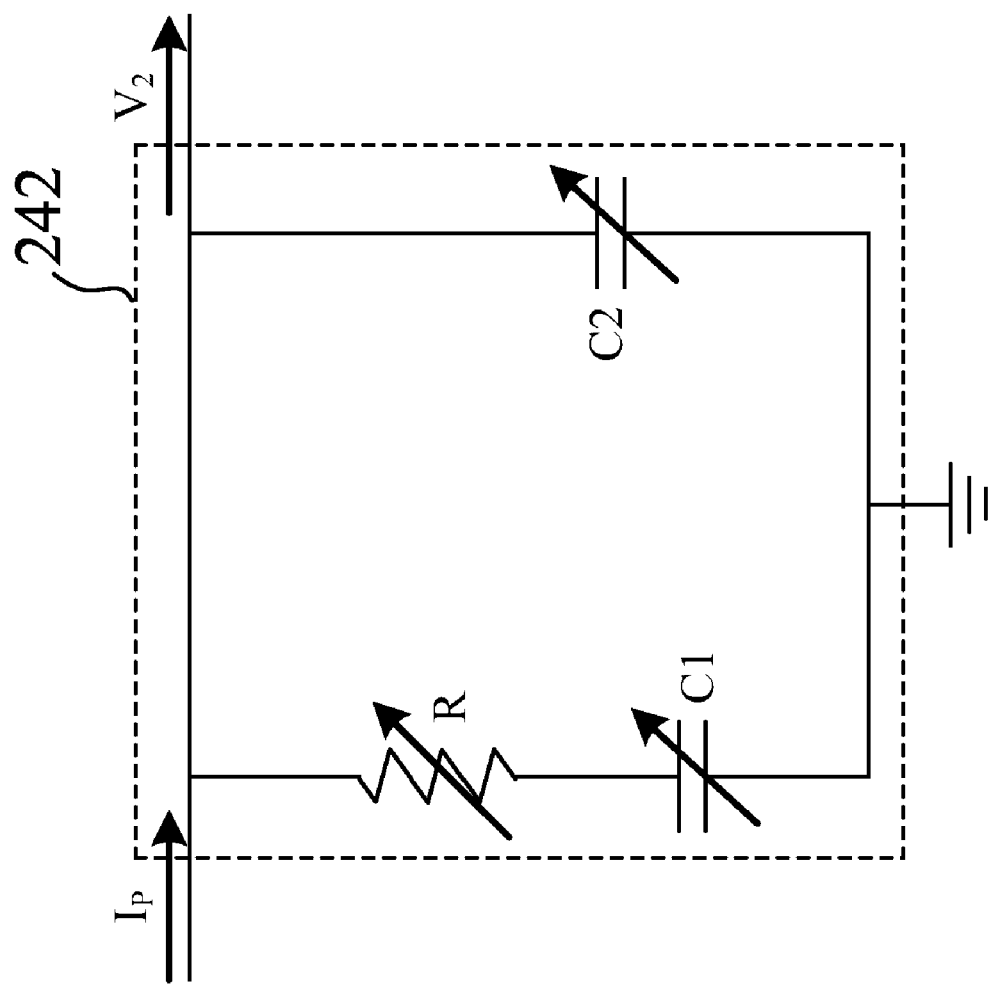
FIG. 4 is a schematic diagram of a second loop filter module in FIG. 3 in accordance with an embodiment of the present disclosure.

In practical applications, the first loop filter module 240 and the second loop filter module 242 may be second-order low-pass filter circuits comprising variable resistors and variable capacitors. FIG. 4 shows a schematic diagram of the second loop filter module 242 in accordance with an embodiment of the present disclosure. The second loop filter module 242 comprises, but not limited to, a variable resistor R and variable capacitors C1 and C2. The variable resistor R connected in series to the variable capacitor C1 is connected in parallel to the variable capacitor C2 to form a second-order low-pass filter circuit. The first loop filter module 240 may be adjusted to different structures according to actual requirements, and details thereof shall not be described for brevity.

Figure 5:
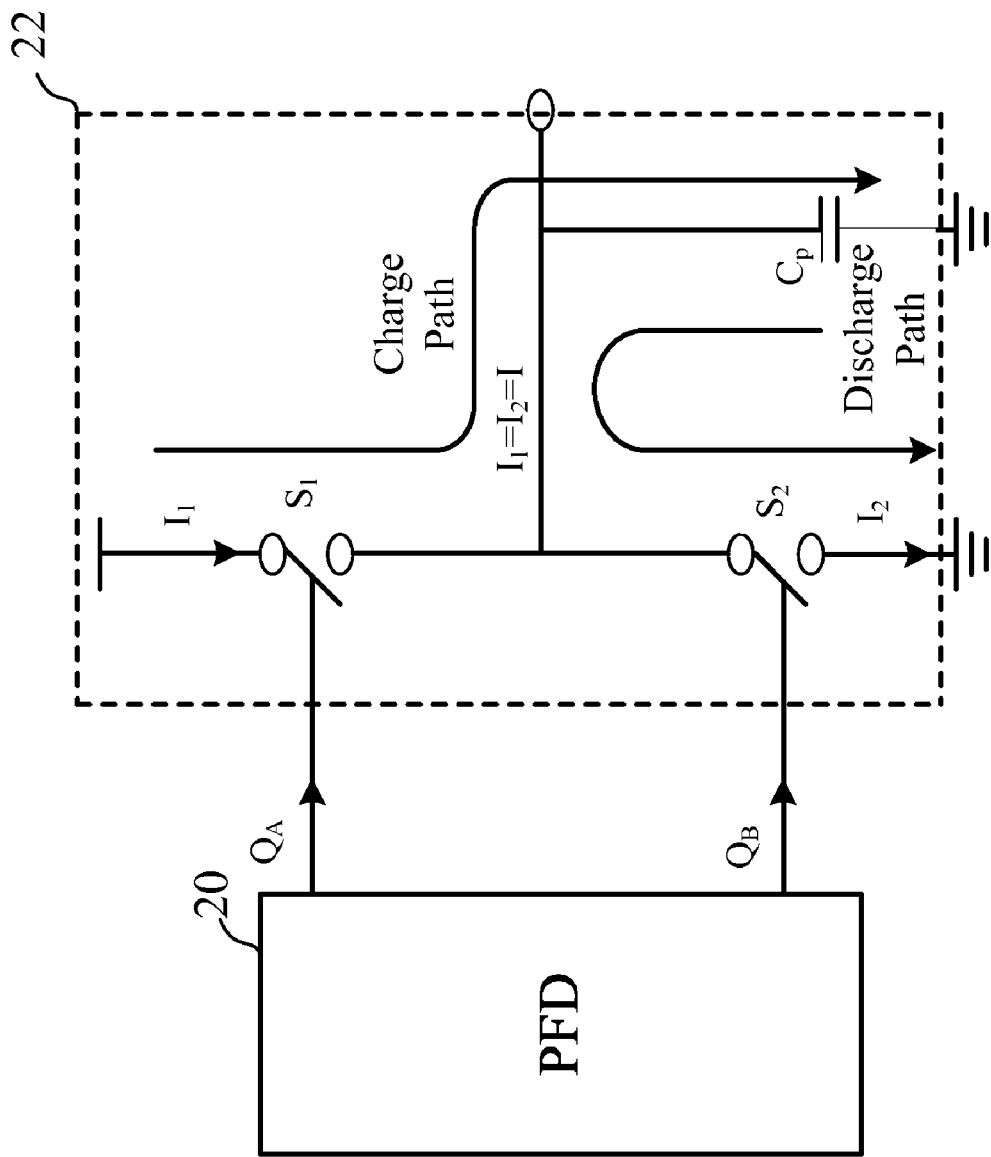
FIG. 5 is a schematic diagram of detailed operations of a PFD and a charge pump in FIG. 3.

FIG. 5 shows a schematic diagram of detailed operations of the PFD 20 and the charge pump 22 in FIG. 3. In the PLL 2, a main function of the charge pump 22 is to pump in or pump out charges in the subsequent first loop filter module 240 or the second loop filter module 242. The PFD 20 opens or closes charge switches $S_1$ and $S_2$ via its two output signals $Q_A$ and $Q_B$. When the output signal $Q_A$ represents "ON" and the output signal $Q_B$ represents "OFF", the charge pump 22 pumps charges into the first loop filter module 240 or the second loop filter module 242 to increase a control voltage $V_c$ of the VCO 26; when the output signal $Q_A$ represents "OFF" and the output signal $Q_B$ represents "ON", the charge pump 22 pumps out charges from the first loop filter module 240 or the second loop filter module 242 to reduce the control voltage $V_c$ of the VCO 26. Supposing that $I_1=I_2=I$, and the charge switches are simultaneously opened, the amount of the pumped-in charges equalizes that of pumped-out charges of the charge pump 22, such that no charges are stored in the first loop filter module 240 or the second loop filter module 242 to effectively reduce the undesirable effects of the first loop filter module 240 or the second loop filter module 242.

Figure 6:
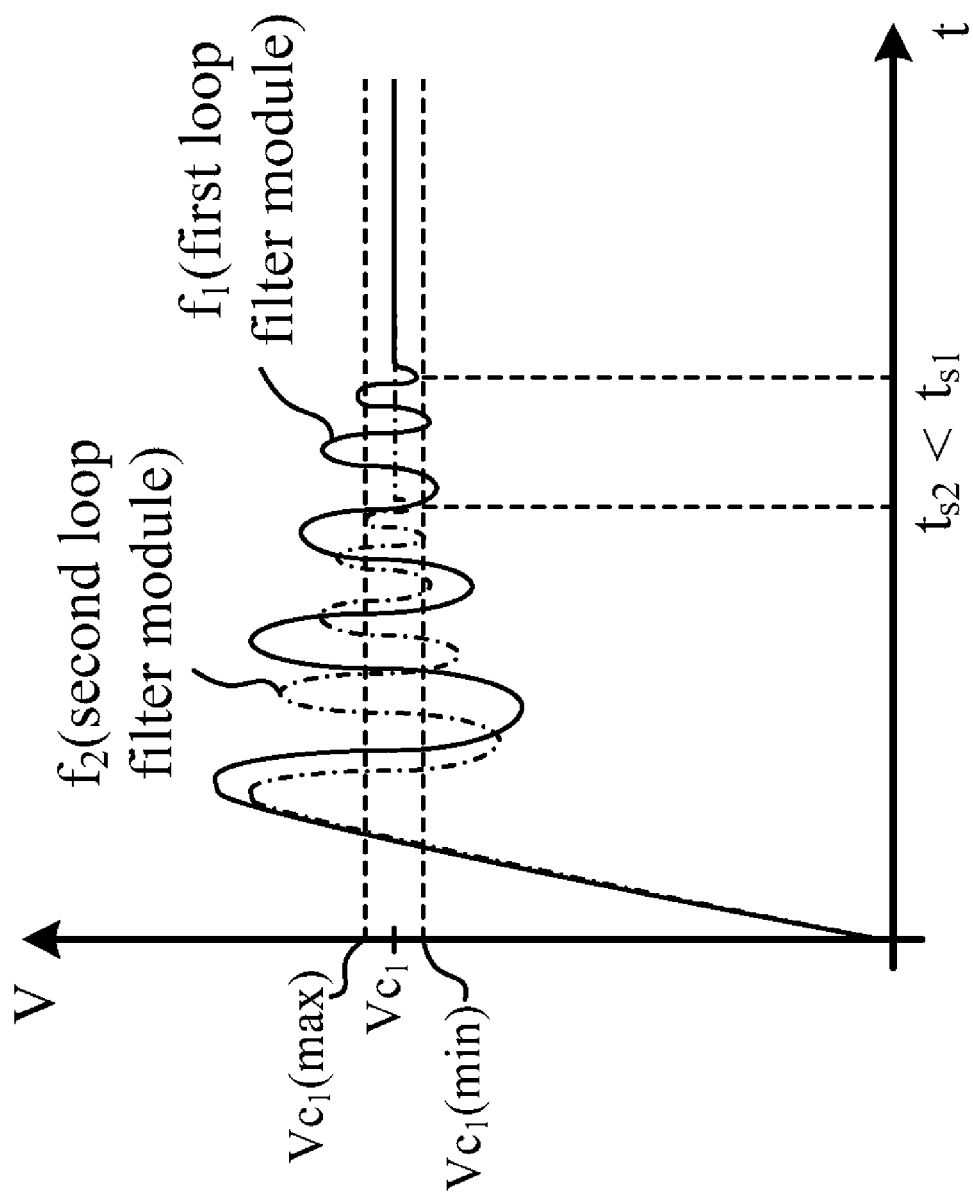
FIG. 6 is a schematic diagram of different locking times from paths formed between a VCO and loop filter modules of different bandwidths.

FIG. 6 shows a schematic diagram of different locking times $t_{s1}$ and $t_{s2}$ from two paths formed between the VCO 26 and the first loop filter module 240 and the second loop filter module 242 of different bandwidths $f_1$ and $f_2$. When the PLL 2 operates under a normal operation mode and the path between charge pump 22 and the VCO 26 is formed via the first loop filter module 240 having the smaller bandwidth $f_1$, the PLL 2 has a normal loop bandwidth, and a locking time for calibrating a control voltage $V_c$ of the VCO 26 is $t_{s1}$, i.e., it takes the locking time $t_{s1}$ for a control voltage $V_c$ of the VCO 26 approximating a reference voltage $V_{c1}$. When the PLL 2 operates under the VCO calibration mode and the path between charge pump 22 and the VCO 26 is formed via the first loop filter module 242 having the larger bandwidth $f_2$, the PLL 2 has a relatively large loop bandwidth, and thus the locking time $t_{s2}$ for calibrating the control voltage $V_{c1}$ of the VCO 26 is shorter than the locking time $t_{s1}$.

Figure 7:
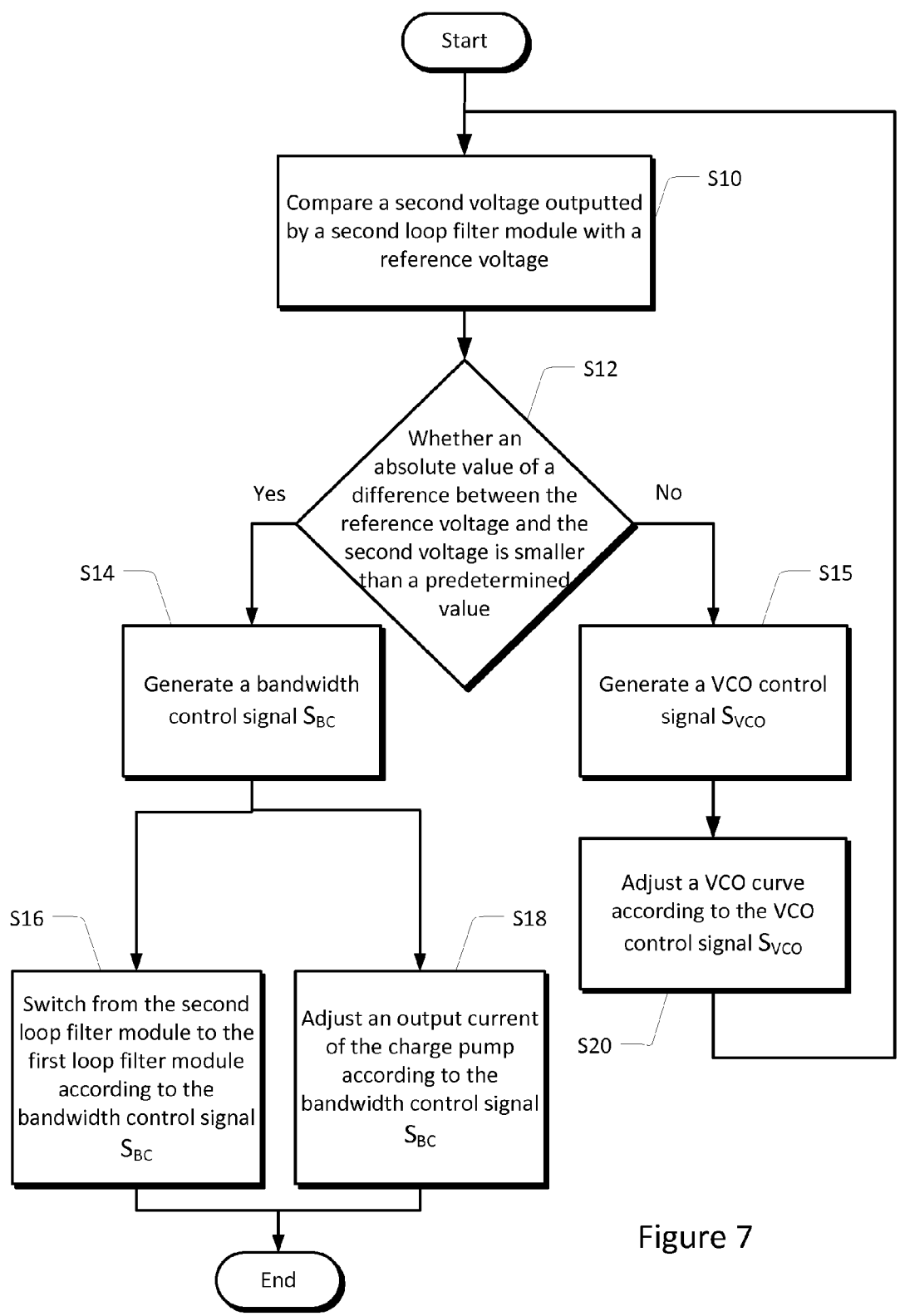
FIG. 7 is a flow chart of a loop bandwidth control method in accordance with a second embodiment of the present disclosure.

According to a second embodiment of the present disclosure, a method for loop bandwidth control is applied to a PLL that comprises a loop bandwidth control apparatus, a PFD, a charge pump and a VCO. The loop bandwidth control apparatus comprises a first loop filter module and a second loop filter module, and a bandwidth of the second loop filter module is greater than that of the first loop filter module. FIG. 7 shows a flow chart of the method for loop bandwidth control.

When the PLL operates under a VCO curve calibration mode, a path between the VCO and the charge pump is formed via the second loop filter module. The method begins with Step S10 in which a reference voltage is compared with a second voltage outputted by the second loop filter module. In Step S12, it is determined whether an absolute value of a difference between the reference voltage and the second voltage is smaller than a predetermined value. For example, the predetermined value is a predetermined value of an overall system or is user-defined according to actual requirements. When a determination result from Step S12 is negative, it means that calibration of an output frequency of the VCO is not yet completed, and the method proceeds to Step S15 in which a VCO control signal $S_{VCO}$ is generated. In Step S20, the VCO 26 adjusts a VCO curve according to the VCO control signal $S_{VCO}$. The foregoing operations are iterated until the determination result of Step 12 is positive, which means that calibration of the output frequency of the VCO is completed, and the method proceeds to Step S14 in which a bandwidth control signal $S_{BC}$ is generated to switch the PLL to a normal operation mode. In Step S16, a loop module is switched from the second loop filter module having a larger bandwidth to the first loop filter module having a smaller bandwidth according to the bandwidth control signal, such that the path between the charge pump and the VCO is formed via the first loop filter module. More specifically, under the VCO calibration mode, the path between the charge pump and the VCO is formed via the second loop filter module having the larger bandwidth to enlarge the loop bandwidth of the PLL, thus reducing a time needed for calibrating the VCO. When the control voltage of the VCO approximates a reference voltage, it means that the calibration of the VCO is completed, and accordingly the loop module is switched to form the path between the charge pump and the VCO via the first loop filter module having the smaller bandwidth. At this point, the PLL under the normal operation mode has a normal loop bandwidth.

In addition, in Step S18, an output current of the charge pump is adjusted according to the bandwidth control signal. Detailed operations of the loop bandwidth control method can be easily appreciated with reference to associated descriptions and diagrams of the first embodiment, and shall not be described for brevity.

Compared to the prior art, according to a loop bandwidth control apparatus and a method thereof, by switching between loop filter modules of different bandwidths, a PLL under a VCO calibration mode has a large loop bandwidth to significantly reduce a time for calibrating a VCO, thus overcome disadvantages of the prior art. In addition, when the PLL operates under a normal operation mode, the loop bandwidth of the PLL recovers to normal without compromising noise eliminating capabilities of the loop filter modules due to a rather-large loop bandwidth.

While the present disclosure has been described in terms of what is presently considered to be the most practical and preferred embodiments, it is to be understood that the present disclosure needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A loop bandwidth control apparatus, applied to a phase locked loop (PLL) comprising a phase frequency detector (PFD), a charge pump and a voltage-controlled oscillator (VCO), the loop bandwidth control apparatus comprising:
   a first loop filter module, coupled to the charge pump, that outputs a first voltage;
   a second loop filter module, coupled to the charge pump, that outputs a second voltage, a bandwidth of the second loop filter module being different from that of the first loop filter module;
   a control module, coupled to the first loop filter module and the second loop filter module, that generates a bandwidth control signal according to the first voltage or the second voltage;
   a first switching module, coupled to the control module and the charge pump, that forms a path between the charge pump and one of the first loop filter module and the second loop filter module according to the bandwidth control signal; and
   a second switching module, coupled to the control module and the VCO, that forms a path between the VCO and one of the first loop filter module and the second loop filter module according to the bandwidth control signal.

2. The loop bandwidth control apparatus as recited in claim 1, wherein the control module generates a VCO control signal according to one of the first voltage and the second voltage, and the VCO adjusts a VCO operating frequency curve according to the VCO control signal.

3. The loop bandwidth control apparatus as recited in claim 2, wherein the control module compares a reference voltage with the first voltage or the second voltage, and generates the bandwidth control signal when an absolute value of a difference between the reference voltage and the first voltage or the second voltage is smaller than a predetermined value.

4. The loop bandwidth control apparatus as recited in claim 1, further comprising:
   a buffer module, coupled to the first loop filter module and the second loop filter module, that equalizes the first voltage outputted by the first loop filter module and the second voltage outputted by the second loop filter module to eliminate a charge sharing effect between the first loop filter module and the second loop filter module.

5. The loop bandwidth control apparatus as recited in claim 4, wherein the buffer module is an operational amplifier (OA) comprising an output end, a positive input end and a negative input end, wherein the negative input end is coupled to the output end of the OA, wherein the positive input end is coupled to an output end of the first loop filter module, and wherein the output end of the OA is coupled to the output end of the first loop filter module.

6. The loop bandwidth control apparatus as recited in claim 1, wherein when the PLL operates under a VCO operating frequency curve calibration mode, wherein a path between the VCO and a charge is formed via the second loop filter module having a larger bandwidth to enlarge a loop bandwidth of the PLL to reduce a locking time for calibrating the VCO.

7. The loop bandwidth control apparatus as recited in claim 1, wherein the control module generates the bandwidth control signal according to a setting signal.

8. The loop bandwidth control apparatus as recited in claim 1, wherein the charge pump adjusts an output current according to the bandwidth control signal generated by the control module.

9. The loop bandwidth control apparatus as recited in claim 1, wherein the first loop filter module and the second loop filter module are low-pass filter circuits respectively comprising variable resistors and variable capacitors.

10. A loop bandwidth control method, applied to a phase locked loop (PLL) comprising a loop bandwidth control apparatus, a phase frequency detector (PFD), a charge pump and a voltage controlled oscillator (VCO), the loop bandwidth control method comprising:
    generating a bandwidth control signal according to one of a first voltage outputted by a first loop filter module of the loop bandwidth control apparatus and a second voltage outputted by a second loop filter module of the loop bandwidth control apparatus, a bandwidth of the second loop filter module being different from that of the first loop filter module; and
    forming a path between the charge pump and the VCO via one of the first loop filter module and the second loop filter module according to the bandwidth control signal.

11. The method as recited in claim 10, further comprising:
    monitoring one of the first voltage and the second voltage to generate a VCO control signal; and adjusting a VCO operating frequency curve according to the VCO control signal.

12. The method as recited in claim 10, wherein generating the bandwidth control signal comprises:
  comparing a reference voltage with one of the first voltage and the second voltage; and
  generating the bandwidth control signal when an absolute value of a difference between the reference voltage and the first voltage or the second voltage is smaller than a predetermined value.

13. The method as recited in claim 10, wherein when the PLL operates in a VCO operating frequency curve calibration mode, a path between the charge pump and the VCO is formed via the second loop filter module having a larger bandwidth to enlarge a loop bandwidth of the PLL and reduce a locking time for calibrating a control voltage of the VCO.

14. The method as recited in claim 10, further comprising:
  equalizing the first voltage outputted by the first loop filter module and the second voltage outputted by the second loop filter module to eliminate a charge sharing effect between the first loop filter module and the second loop filter module.

15. The method as recited in claim 10, further comprising:
  adjusting an output current of the charge pump according to the bandwidth control signal.

16. A phase locked loop (PLL), comprising:
  a phase frequency detector (PFD) that generates a phase difference between a reference clock and a feedback clock;
  a charge pump, coupled to the PFD that generates an output current according to the phase difference;
  a voltage controlled oscillation (VCO) that generates an output frequency according to a control voltage;
  a frequency divider that generates the feedback clock according to the output frequency; and
  a loop bandwidth control apparatus, comprising:
    a first loop filter module, coupled to the charge pump, that generates a first voltage according to the output current;
    a second loop filter module, coupled to the charge pump, that generates a second voltage according to the output current, a bandwidth of the second loop filter module being larger than that of the first loop filter module;
    a control module, coupled to the first loop filter module and the second loop filter module, that monitors the first voltage and the second voltage, and generates a bandwidth control signal according to the first voltage and the second voltage;
    a first switching module, coupled to the control module and the charge pump, that forms a path between the charge pump and one of the first loop filter module and the second loop filter module; and
    a second switching module, coupled to the control module and the VCO, that forms a path between the VCO and one of the first loop filter module and the second loop filter module according to the bandwidth control signal.

17. The PLL as recited in claim 16, wherein the control module generates a VCO control signal according to one of the first voltage and the second voltage, and wherein the VCO adjusts a VCO curve according to the VCO control signal.

18. The PLL as recited in claim 17, wherein the control module compares a reference voltage with the first voltage or the second voltage, and generates the bandwidth control signal when an absolute value of a difference between the reference voltage and the first voltage or the second voltage is smaller than a predetermined value.

19. The PLL as recited in claim 16, further comprising:
  a buffer module, coupled to the first loop filter module and the second loop filter module, that equalizes the first voltage outputted by the first loop filter module and the second voltage outputted by the second loop filter module to eliminate a charge sharing effect between the first loop filter module and the second loop filter module.

20. The PLL as recited in claim 19, wherein the buffer module is an operation amplifier comprising an output end, a positive input end and a negative input end, wherein the negative input end is coupled to the output end, wherein the positive input end is coupled to an output end of the first loop filter module, and wherein the output end of the operation amplifier is coupled to the output end of the first loop filter module.

* * * * *